United States Patent [19]

Clorfeine

[11] 3,793,539

[45] Feb. 19, 1974

[54] CIRCUIT FOR OPERATING AN AVALANCHE DIODE IN THE ANOMALOUS MODE

[75] Inventor: Alvin Seymour Clorfeine, Cranbury, N.J.

[73] Assignee: RCA Corporation, New York, N.Y.

[22] Filed: Sept. 18, 1972

[21] Appl. No.: 289,781

[52] U.S. Cl. .............. 307/287, 307/318, 331/107 R

[51] Int. Cl. .............. H03k 17/00

[58] Field of Search .... 331/96, 99, 107 R; 333/735, 333/84 M; 307/287, 323

[56] References Cited

UNITED STATES PATENTS 3,721,918 3/1973 Rosen et al. .................... 333/84 M 3,721,919 3/1973 Grace .................... 333/84 M

*Primary Examiner*—Rudolph V. Rolinec

*Assistant Examiner*—B. P. Davis

*Attorney, Agent, or Firm*—Edward J. Norton; Joseph D. Lazar; Donald E. Mahoney

[57] ABSTRACT

The operaton of an avalanche diode in the anomalous mode is improved by coupling the diode to a circuit designed to provide an impedance match to the diode at the desired operating frequency and a substantially zero resistance and zero reactance at the second harmonic of the desired operating frequency. The circuit provides a substantially reactive termination to diode generated energy at all other harmonic frequencies.

6 Claims, 3 Drawing Figures

CIRCUIT FOR OPERATING AN AVALANCHE DIODE IN THE ANOMALOUS MODE

The invention herein was made in the course of or under contract or subcontract thereunder with the Department of the Air Force.

DESCRIPTION OF THE PRIOR ART

A microwave oscillator circuit using an avalanche diode operative in the anomalous or high efficiency mode is described in an article entitled "Subharmonic Generation and the Trapped-Plasma Mode in Avalanching *p+–n–n+* Junctions" by Craig P. Snapp published in the IEEE Transactions on Electron Devices, May 1971, Vol. ED—18, No. 5. An avalanche diode is responsive to an applied reverse bias signal exceeding a predetermined threshold magnitude. The properly biased avalanche diode operative in the anomalous mode is triggered into generating energy at a desired operating frequency and harmonics of the desired operating frequency when it is part of a specific microwave circuit. The prior art microwave circuits comprised low pass filters or tuning elements separated from the diode terminals by a predetermined electrical length of transmission line. The low pass filter or tuning elements provided a necessary reflective termination for diode generated energy at harmonic frequencies. The low pass filter or tuning elements also provided an impedance match for the diode at the desired operating frequency. The operating frequency of the prior art avalanche diode circuit is essentially determined by the predetermined electrical length of transmission line separating the diode from reflective elements of the low pass filter.

Certain relatively low operating frequencies or preferred methods of manufacture preclude the use of a frequency determining electrical length of transmission line. The disclosed improved circuit meets all the requirements and limitations for operating an avalanche diode in the anomalous mode but without the use of a frequency determining length of transmission line.

SUMMARY OF THE INVENTION

A circuit comprising a combination of multiple inductors and capacitors coupled across the two terminals of a negative resistance semiconductive device enables the anomalous mode of device operation when a reverse bias signal exceeding a predetermined threshold magnitude is coupled across the device terminals. The applied reverse bias signal triggers the device generation of energy at a desired frequency of operation and at least a second harmonic of the desired frequency. The circuit provides an impedance match to the device at the desired frequency and a substantially zero resistance and zero reactance at the second harmonic frequency. The circuit provides a substantially reactive termination to diode generated energy at all other harmonic frequencies.

BRIEF DESCRIPTION OF THE DRAWINGS

Referring to FIG. 1, there is shown a schematic of a prior art microwave oscillator using an avalanche diode operative in the anomalous or high efficiency mode. An avalanche diode, D, is coupled to a microwave transmission line 10 that is part of a complementary microwave filtering circuit 11. The microwave filtering circuit 11 is designed to match the impedance of the diode, D, to the impedance of a terminating load, not shown, at a desired frequency, $f_0$. A D.C. reverse bias signal is applied across the terminals of the diode, D. The magnitude of the D.C. bias signal exceeds the breakdown voltage of the diode, D. An applied reverse bias signal, slightly greater than the breakdown voltage of the diode, D, will cause a displacement current or electric field in the depletion layer of the diode's semiconductive material. The diode carriers are ionized at the point of maximum electric field within the depletion layer. The carrier density is increased when the ionized carriers collide with other atoms and create more carriers. The displacement current can also be considered as causing a wavefront, moving with a specific wave velocity, provided the magnitude of the current is sufficiently large. If the wave velocity associated with the displacement current is greater than the saturation velocity of the carriers, a high density of holes and electrons will be left in the wake of this wavefront. As a result of the concentration of holes and electrons, the electric field is reduced and the velocity of the carriers is diminished leading to the formation of a dense plasma. Microwave energy is obtained from an avalanche diode by extraction of energy from the trapped plasma.

The necessary displacement current and the associated fast rise time of the electric fields within the diode can be achieved by utilizing the high frequency signals created by ionization at low currents. The high frequency signals trigger the avalanche diode into a high efficiency mode of operation, the anomalous mode. The avalanche diode then emits energy at a frequency which is related to the ratio of the depletion layer width to the velocity of the carriers in the plasma, and the design of the complementary microwave circuitry. The microwave filtering circuit 11 is also designed to present a reactive termination that reflects energy at frequencies harmonically related to the desired frequency of operation, $f_0$. By way of illustration, an example of such a filtering circuit 11 is a low pass filter or a band-pass filter resonant at the frequency $f_0$. Prior art devices generally have been designed so that the frequency of operation depends on the round trip delay time required for the diode generated microwave signals harmonically related to the operating frequency, $f_0$, to be reflected by the microwave filtering circuit 11 back toward the terminals of the diode, D. The reflected diode generated harmonic signals combine with the reverse bias signals to trigger the next cycle of diode operation. The operating frequency, $f_0$, of these prior art devices is therefore dependent upon the electrical length, $l$, between the reflective plane of the microwave filtering circuit 11 and the diode, D.

Figures 1, 2:
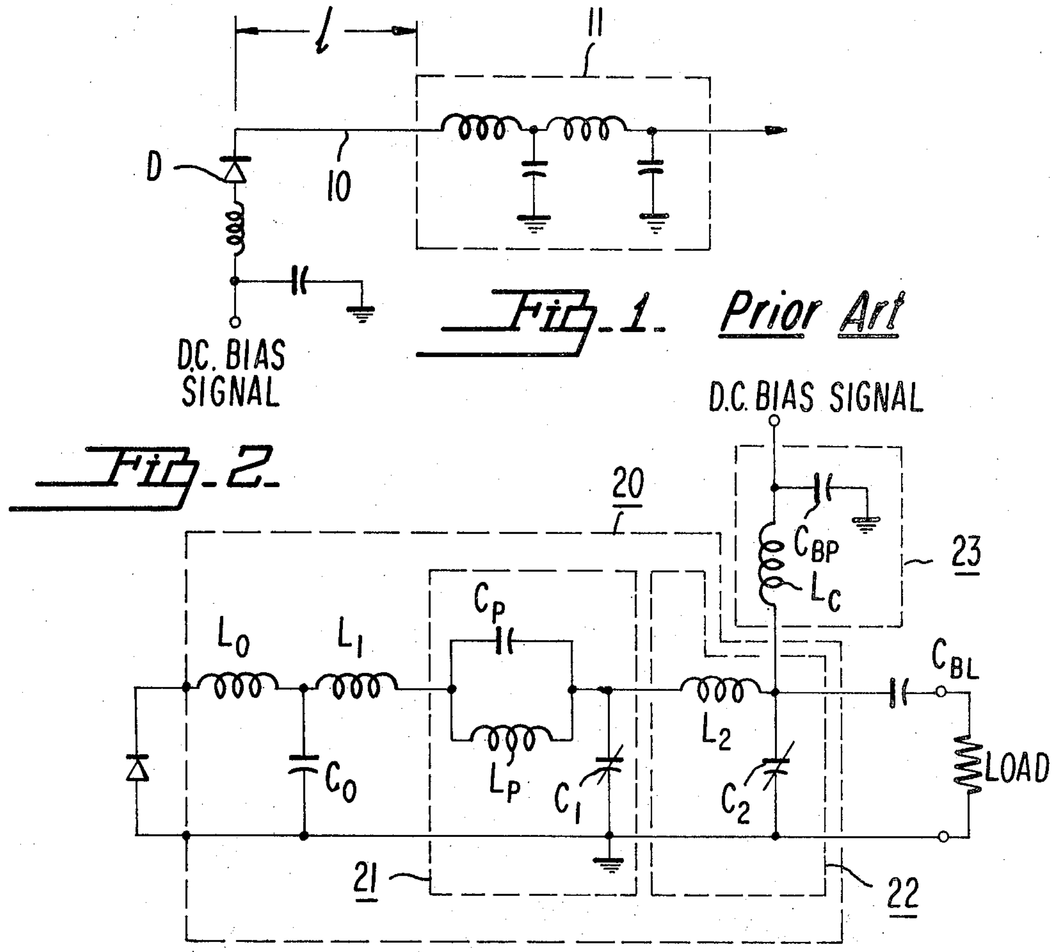
Fig. 1. Prior Art Fig. 2.
FIG. 1 is a schematic of a prior art microwave oscillator using an avalanche diode operating in the anomalous or high efficiency mode.
FIG. 2 is a schematic of a lumped element microwave oscillator according to one embodiment of the invention.

Referring to FIG. 2, there is shown a schematic of an improved lumped-element oscillator circuit using an avalanche diode operating in the high efficiency or anomalous mode. A low pass filter circuit 20 comprising a combination of a shunt $m$-derived half section 21 and a constant $k$ half section 22 is designed to match the impedance of the diode, D, to the terminating load impedance. The low pass filter circuit 20 also presents a reactive termination for diode generated energy at frequencies harmonically related to the operating frequency, $f_o$. The reactive termination presented by the low pass filter circuit 20 reflects diode generated energy at harmonic frequencies back to the terminals of diode D. The reflected diode generated energy is needed to continue the high efficiency or anomalous mode of diode operation. However, unlike other low pass filter designs, the shunt $m$-derived half section 21 of the low pass filter 20 is designed to provide zero magnitude impedance at the second harmonic of the desired operating frequency, $f_o$. The constant $k$ half section 22 is designed to match the impedance of the diode at the operating frequency, $f_o$, to the load impedance. The combination of inductance $L_o$ and capacitance $C_o$ is tuned to present a reflective mismatch at frequencies that are third harmonic and higher harmonics of the operating frequency, $f_o$. The inductance $L_1$ is not essential to the design but is a necessary geometric inductance in connecting the elements.

It is believed that the design of the low pass filter 20 to include a shunt $m$-derived half section 21 tuned to provide a specific zero magnitude impedance at the second harmonic frequency eliminates the requirement for a predetermined delay time for the necessary harmonic signals reflected back to the diode, D. The low pass filter 20 is designed so that the tuning of the shunt $m$-derived half section 21 to provide the desired zero magnitude impedance at the second harmonic frequency does not interfere with the impedance transformation from the diode impedance to the load impedance at the operating frequency, $f_o$. The resistance and reactance of the diode impedance at the operating frequency, $f_o$, is substantially different from the diode resistance and reactance at the second harmonic of the operating frequency, $f_o$.

The D.C. bias signal, from a source not shown, is coupled to the diode D via the biasing circuit 23. The biasing circuit 23 is a low pass filter designed to block the transmission of diode generated microwave signals from the external bias source. The low pass filter circuit 20 isolates the diode, D, from the biasing circuit 23. Any slight impedance mismatch provided by the biasing circuit 23 is included with the load impedance as the impedance to be matched to the diode impedance. The low pass filter circuit 20 thus provides the proper impedance transformation from the diode, D, to the combination of load impedance and biasing circuit 23 mismatch. The location of the low pass filter circuit 20 between the biasing circuit 23 and diode, D, also aids in the blocking of diode generated energy at harmonically related frequencies from the external bias source.

An improved high efficiency mode avalanche diode oscillator circuit using lumped elements and designed to operate at 520 mHz provided 360 watts of output power at 37 percent efficiency. The diode used in the circuit was a $P^+NN^+$ silicon avalanche diode with a breakdown voltage of 190 volts. The diameter of the diode was 0.033 inch. The junctions were formed by boron diffusion into $n$-type silicon epitaxial wafers. The resistivity of the epitaxial layer was approximately 6 ohm-cm. A lumped element 3 nanohenry inductor, $L_o$, which included the diode-package inductances, was tuned with a variable tuning capacitor, $C_o$, having a capacitance range from 0.6 to 6 picofarads to provide a reflective termination for energy at the third and higher harmonic frequencies. A lumped element 2 nanohenry inductor connected the junction of the inductor $L_o$ and capacitor $C_o$ to the shunt $m$-derived half section 21. A lumped element 5 nanohenry inductor, $L_p$, a variable lumped element tuning capacitor, $C_p$, having a capacitance range from 0.6 to 6 picofarads and a second variable lumped element tuning capacitor, $C_1$, having a capacitance range from 0.8 to 10 picofarads formed the $m$-derived half section 21. A lumped element 30 nanohenry inductor, $L_2$, and a lumped element tuning capacitor, $C_2$, having a capacitance range from 0.9 to 10 picofarads formed the constant $k$ half section 22. A lumped element 100 nanohenry inductor, $L_c$, and a lumped element 100 picofarad capacitor, $C_{BP}$, formed the biasing filter 23. A 100 picofarad blocking capacitor, $C_{BL}$, coupled between the low pass filter 20 and the load prevented the coupling of the D.C. bias signal to the load. The magnitude of the blocking capacitor, $C_{BL}$, provided a low impedance to signals at 520 mHz.

Figure 3:
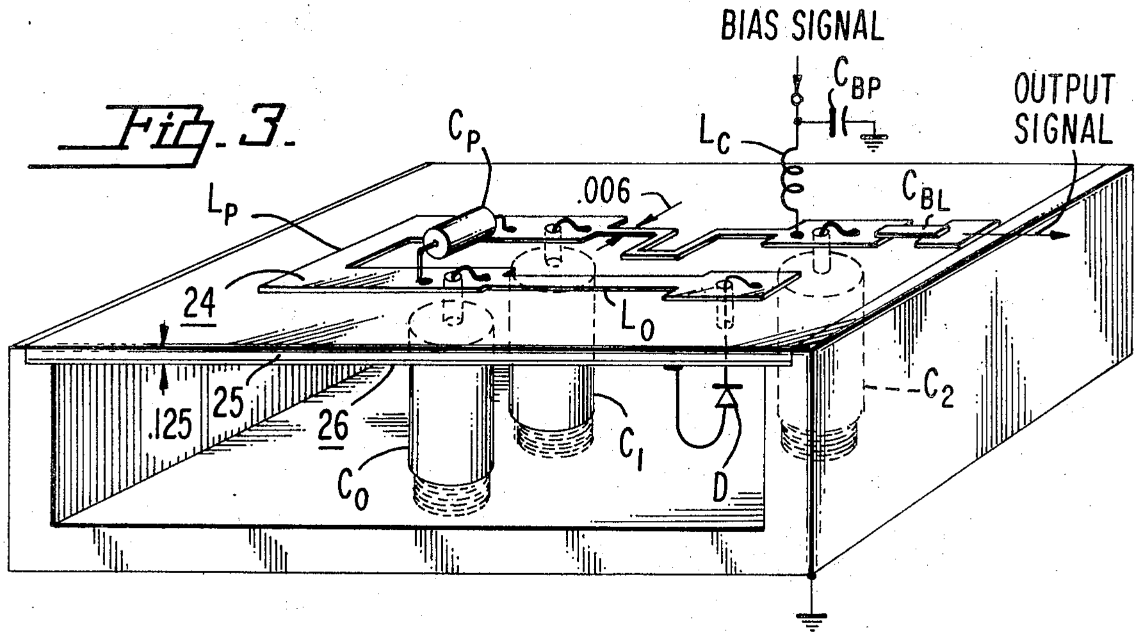
FIG. 3 is a plan view of a microwave oscillator according to one embodiment of the invention.

Referring to FIG. 3, there is shown a plan view of an improved high efficiency mode avalanche diode oscillator circuit using a combination of printed circuit techniques and lumped elements. The oscillator circuit is 26 percent efficient when providing 300 watts of output power at 1.2 GHz. The breakdown voltage of the diode used in the 1.2 GHz oscillator is 140 volts. The conductive strip 24 on the top surface of the dielectric substrate 25 is a transmission line for diode generated microwave energy. The conductive strip 26 covering the entire bottom surface of the dielectric substrate 25 is a ground planar conductor. The inductors $L_o$, $L_p$ and $L_2$ perform the same electrical function in FIG. 3 as they do in FIG. 2. The inductors $L_o$, $L_p$ and $L_2$ are conductive strips having an effective electrical length substantially less than a resonant fraction of a wavelength, $\lambda$, at the operating frequency, $f_o$. The impedances of the inductors $L_o$, $L_p$ and $L_2$ are essentially determined by the width and length of the conductive strips. For example, the width of the $L_o$ and $L_p$ conductive strips is 0.150 inch and the length is 0.300 inch. The width of the $L_2$ conductive strip is 0.006 inch and the effective overall length is 0.5 inch. The thickness of the dielectric substrate 25 is 0.125 inch. The dielectric constant, $\epsilon_r$, of the dielectric substrate is 2.1.

It is known in the prior art that an anomalous or high efficiency mode avalanche diode oscillator circuit can be used as a microwave amplifier when a combination of microwave and D.C. signals are used to bias or trigger the diode into operation. The magnitude of the applied D.C. signal is less than the predetermined threshold level. A three port directional device such as a circulator is usually used to couple the microwave signal to the diode and microwave circuit via a directional transmission path from port 1 to port 2 of the circulator. Port 2 of the circulator would be coupled to the output signal port of the circulator and the microwave signal is fed to port 1 of the circulator. The diode generated microwave energy is then transmitted along a directional transmission path from port 2 of the circulator to a load terminating port 3 of the circulator. In the prior art one limitation on the operating bandwidth of the amplifier is the critical frequency determining electrical length between the diode and the reflective plane for the diode generated harmonic frequencies. The improved high efficiency mode avalanche diode oscillator circuit eliminates the critical frequency determining electrical length between the diode and the reflective plane for the diode generated harmonic frequencies, thus increasing the operating bandwidth of a high efficiency mode avalanche diode amplifier circuit.

What is claimed is:

1. Apparatus comprising:

a two terminal negative resistance semiconductive device operative in the anomalous mode;

means for applying a reverse bias signal exceeding a predetermined threshold magnitude across said device terminals to cause said device to be triggered into said anomalous mode of operation and generating energy at a desired frequency and at least a second harmonic of said desired frequency; and a circuit comprising a combination of multiple inductors and capacitors directly connected across said device terminals providing an impedance match to said device at said desired frequency and a substantially zero resistance and zero reactance at said second harmonic frequency, said circuit providing a substantially reactive termination to diode generated energy at all other harmonic frequencies.

2. Apparatus according to claim 1, wherein said circuit is a low pass filter circuit having a constant *k* half section and a shunt *m*-derived half section.

3. Apparatus according to claim 2, wherein said constant *k* half section is tuned to provide said impedance match to said device at said desired frequency and said shunt *m*-derived half section is tuned to provide said zero resistance and zero reactance at said second harmonic frequency.

4. Apparatus according to claim 1, wherein said reverse bias signal is a D.C. bias signal having a magnitude exceeding said predetermined threshold magnitude, whereby said device is triggered into oscillating in said anomalous mode at said desired frequency.

5. Apparatus according to claim 1, wherein said reverse bias signal is a combination of a D.C. bias signal having a magnitude less than said threshold magnitude and a microwave signal at said desired frequency, said signal combination having a magnitude exceeding said predetermined threshold magnitude, whereby said device is triggered into amplifying said microwave signal.

6. Apparatus comprising:

a two terminal negative resistance semiconductive device operative in the anomalous mode;

means for applying a reverse bias signal exceeding a predetermined threshold magnitude across said device terminals to cause said device to be triggered into said anomalous mode of operation and generating energy at a desired frequency and at least a second harmonic of said desired frequency; and a low pass filter circuit directly connected across said device terminals, said circuit having a first section tuned to provide an impedance match to said device at said desired frequency and a second section tuned independent of said first section to provide a substantially zero resistance and zero reactance at said second harmonic frequency, said circuit providing a substantially reactive termination to diode generated energy at all other harmonic frequencies.

* * * * *